United States Patent
Ishii et al.

[11] Patent Number: 6,046,409
[45] Date of Patent: Apr. 4, 2000

[54] MULTILAYER MICROELECTRONIC CIRCUIT

[75] Inventors: Tetsuya Ishii; Hiroshi Katagiri, both of Aichi; Tadashi Shingaki, Mie; Tatsuya Takemura, Gifu, all of Japan

[73] Assignee: Ngk Spark Plug Co., Ltd., Nagoya, Japan

[21] Appl. No.: 09/031,074

[22] Filed: Feb. 26, 1998

[30] Foreign Application Priority Data

Feb. 26, 1997 [JP] Japan .................................. 9-042750

[51] Int. Cl.[7] .................. H05K 1/11; H03H 3/02
[52] U.S. Cl. .................. 174/255; 174/260; 333/175; 333/185; 333/219
[58] Field of Search .................. 174/260, 255, 174/261; 333/185, 219, 175; 361/790, 795

[56] References Cited

U.S. PATENT DOCUMENTS

| | | |
|---|---|---|
| 3,349,480 | 10/1967 | Rashleigh . |
| 4,821,007 | 4/1989 | Fields et al. ............................. 333/238 |
| 5,160,907 | 11/1992 | Nakajima et al. ...................... 333/246 |
| 5,404,118 | 4/1995 | Okamura et al. ................... 333/185 X |
| 5,612,656 | 3/1997 | Sakamoto et al. ................. 333/185 X |

FOREIGN PATENT DOCUMENTS 0 617 478  9/1994  European Pat. Off. .
2-306709  12/1990  Japan ..................................... 333/185

*Primary Examiner*—Hyung-Sub Sough
*Attorney, Agent, or Firm*—Foley & Lardner

[57] ABSTRACT

A multilayer microelectronic circuit to be directly mounted on a substrate and to be used, for example, as a resonator. The multilayer microelectronic circuit comprises a plurality of dielectric layers and patterned electrodes which are laminated one upon another to form a laminated structure, the dielectric layers and the patterned electrodes forming an electrical circuit. The laminated structure has side surfaces extending along a direction in which the dielectric layers and the patterned electrodes are laminated. An input line is formed at one of the side surfaces and connected with an input section of the electrical circuit. An output line is formed at one of the side surfaces and connected with an output section of the electrical circuit. A grounding line is formed at one of the side surfaces and connected with a grounding section of the electrical circuit. Additionally, a signal line formed at one of the side surfaces, for connecting sections of the electrical circuit. The signal line has an end positioned adjacent a mounting surface at which the multilayer microelectronic circuit is directly mounted on the substrate, in which the end of the signal line is separate from the mounting surface so as to be insulated from electrical contact with the substrate.

8 Claims, 5 Drawing Sheets

MULTILAYER MICROELECTRONIC CIRCUIT

BACKGROUND OF THE INVENTION

1. Field of the Invention

This invention relates to improvements in a multilayer microelectronic circuit which is used to be directly mounted on the surface of a substrate, and more particularly to the technique for forming a signal line of the circuit to be in a disconnected state relative to the substrate.

2. Description of the Prior Art

It is well known that a multilayer microelectronic circuit constructed and used as a resonator or the like is produced by laminating a plurality of dielectric layers and patterned electrodes. An example of such a multilayer microelectronic circuit J is constructed in a structure shown in FIGS. 7 and 8 to form an electrical circuit, in which an input line I', an output line O', grounding lines G' and signal lines NC' are formed at the side surfaces S1' of the multilayer microelectronic circuit. The input line I' is connected with an input section of the electrical circuit. The output line O' is connected with an output section of the electrical circuit. The grounding lines G' is connected with a grounding section of the electrical circuit. The signal line NC' is formed to connect various sections of the electrical circuit. This multilayer microelectronic circuit is directly mounted at its mounting surface (or lower surface) S2' on the surface of an electrical substrate K as shown in FIG. 8 where the upper surface S3' is observed. The mounting surface (or the lower surface) is shown in FIG. 7.

In the multilayer microelectronic circuit, all the above-mentioned electrically conductive lines are formed reaching the mounting surface as shown in FIG. 7. Additionally, as shown in FIG. 8, the input line I' is connected with a patterned signal input contact Ib' of the substrate K. The output line O' is connected with a patterned signal output contact Ob' of the substrate K. The grounding lines G' are connected with a patterned grounding contact Gb' of the substrate K.

However, drawbacks have been encountered in the above-arranged conventional multilayer microelectronic circuit, as set forth below. Each signal line NC' is adapted to connect the various sections of the electrical circuit formed inside the multilayer microelectronic circuit and therefore is required to be disconnected from the various patterned wiring of the substrate K. Accordingly, the substrate is formed on its surface with a section α to which the signal line is electrically connected, and a generally circular insulating section β for insulating the section α from electrical contact with other sections such as the patterned grounding contact Gb'.

Thus, with the above-discussed conventional technique, it is required to perform a process for forming the insulating sections β at the surface of the substrate K in order to prevent the signal lines NC' of the multilayer microelectronic circuit J from being electrically contacted with the patterned wiring of the substrate K. This degrades the serviceableness of the multilayer microelectronic circuit.

SUMMARY OF THE INVENTION

It is an object of the present invention to provide an improved multilayer microelectronic circuit which can effectively overcome drawbacks encountered in conventional similar multilayer microelectronic circuits.

Another object of the present invention is to provide an improved multilayer microelectronic circuit which is excellent in serviceableness while making it unnecessary to accomplish a process for forming an insulating section on the surface of a substrate on which the circuit is directly mounted.

A further object of the present invention is to provide an improved multilayer microelectronic circuit which has signal lines for electrically connecting various sections of an electrical circuit, in which each line is formed in a disconnected state relative to a patterned wiring of a substrate on which the multilayer microelectronic circuit is directly mounted.

An aspect of the present invention resides in a multilayer microelectronic circuit which is to be directly mounted on a substrate and comprises a plurality of dielectric layers and patterned electrodes which are laminated one upon another to form a laminated structure, the dielectric layers and the patterned electrodes forming an electrical circuit. The laminated structure has side surfaces extending along a direction in which the dielectric layers and the patterned electrodes are laminated. An input line is formed at one of the side surfaces and connected with an input section of the electrical circuit. An output line is formed at one of the side surfaces and connected with an output section of the electrical circuit. A grounding line formed at one of the side surfaces and connected with a grounding section of the electrical circuit. Additionally, a signal line formed at one of the side surfaces, for connecting sections of the electrical circuit. The signal line has an end positioned adjacent a mounting surface at which the multilayer microelectronic circuit is directly mounted on the substrate, in which the end of the signal line is separate from the mounting surface so as to be insulated from electrical contact with the substrate.

Another aspect of the present invention resides a multilayer microelectronic circuit which is to be directly mounted on a substrate and comprises a plurality of dielectric layers and patterned electrodes which are laminated one upon another to form a laminated structure. The dielectric layers and said patterned electrodes form an electrical circuit. The laminated structure has side surfaces extending along a direction in which said dielectric layers and said patterned electrodes are laminated. The dielectric layers includes a lower-most dielectric layer which has a mounting surface at which said multilayer microelectronic circuit is directly mounted on the substrate. The dielectric layers other than said lower-most dielectric layer are formed respectively with grooves which form a channel at one of the side surfaces. The lower-most dielectric layer is free of said groove. An input line is formed at one of said side surfaces and connected with an input section of said electrical circuit. An output line is formed at one of said side surfaces and connected with an output section of said electrical circuit. A grounding line is formed at one of said side surfaces and connected with a grounding section of said electrical circuit. Additionally, a signal line is formed at the surface of said channel, for connecting sections of said electrical circuit. The signal line has an end positioned adjacent said mounting surface. The end of said signal line is separate from said mounting surface so as to be insulated from electrical contact with the substrate.

With the thus arranged multilayer microelectronic circuit, the signal line is formed in a disconnected state at their lower end formed at the side surface of the multilayer microelectronic circuit, thereby overcoming the conventional drawbacks in which the signal line is brought into connection with a patterned wiring of the substrate even though the multilayer microelectronic circuit is directly mounted on the substrate. Thus, it is unnecessary to process the multilayer microelectronic circuit in such a manner to disconnect the signal line from the substrate, and therefore the multilayer microelectronic circuit is largely improved in its serviceableness as compared with conventional similar multilayer microelectronic circuits. Preferably, the disconnected state of the signal line is accomplished by forming no channel in the lower-most dielectric layer to be in direct contact with the substrate. Accordingly, obtaining the disconnected state of the signal line can be largely facilitated thereby lowering the production cost of the multilayer microelectronic circuit.

DETAILED DESCRIPTION OF THE INVENTION

Figure 4:
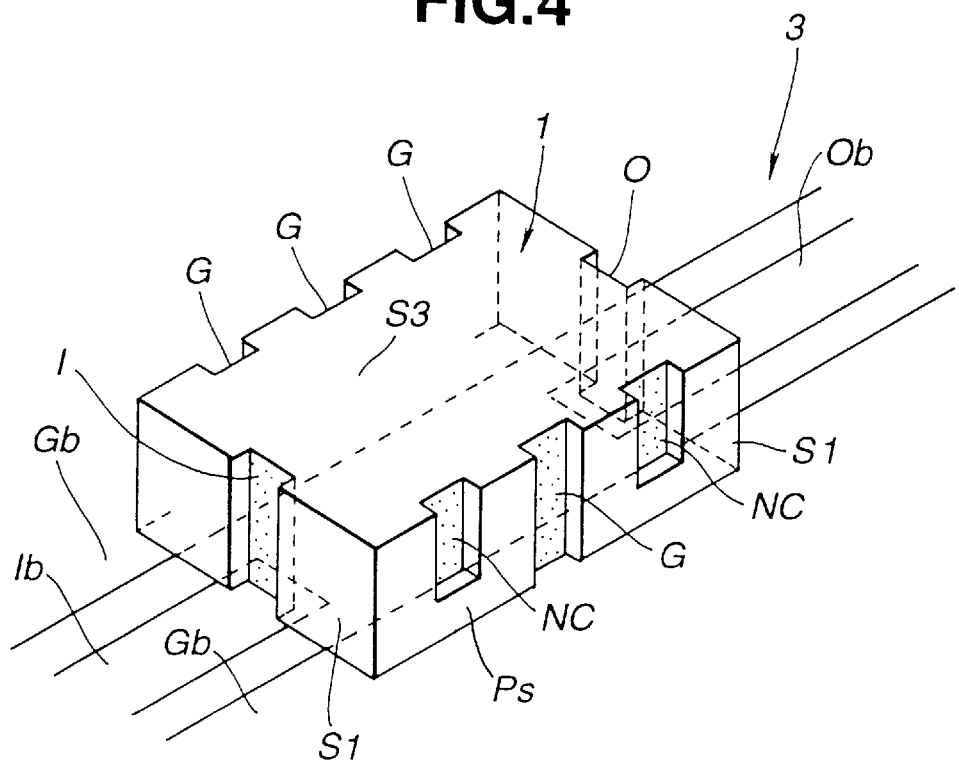
FIG. 4 is a perspective view of the multilayer microelectronic circuit of FIG. 1 in a state to be directly mounted at its lower surface on a substrate, as viewed from a direction in which the upper surface of the circuit is observed.
Figure 5:
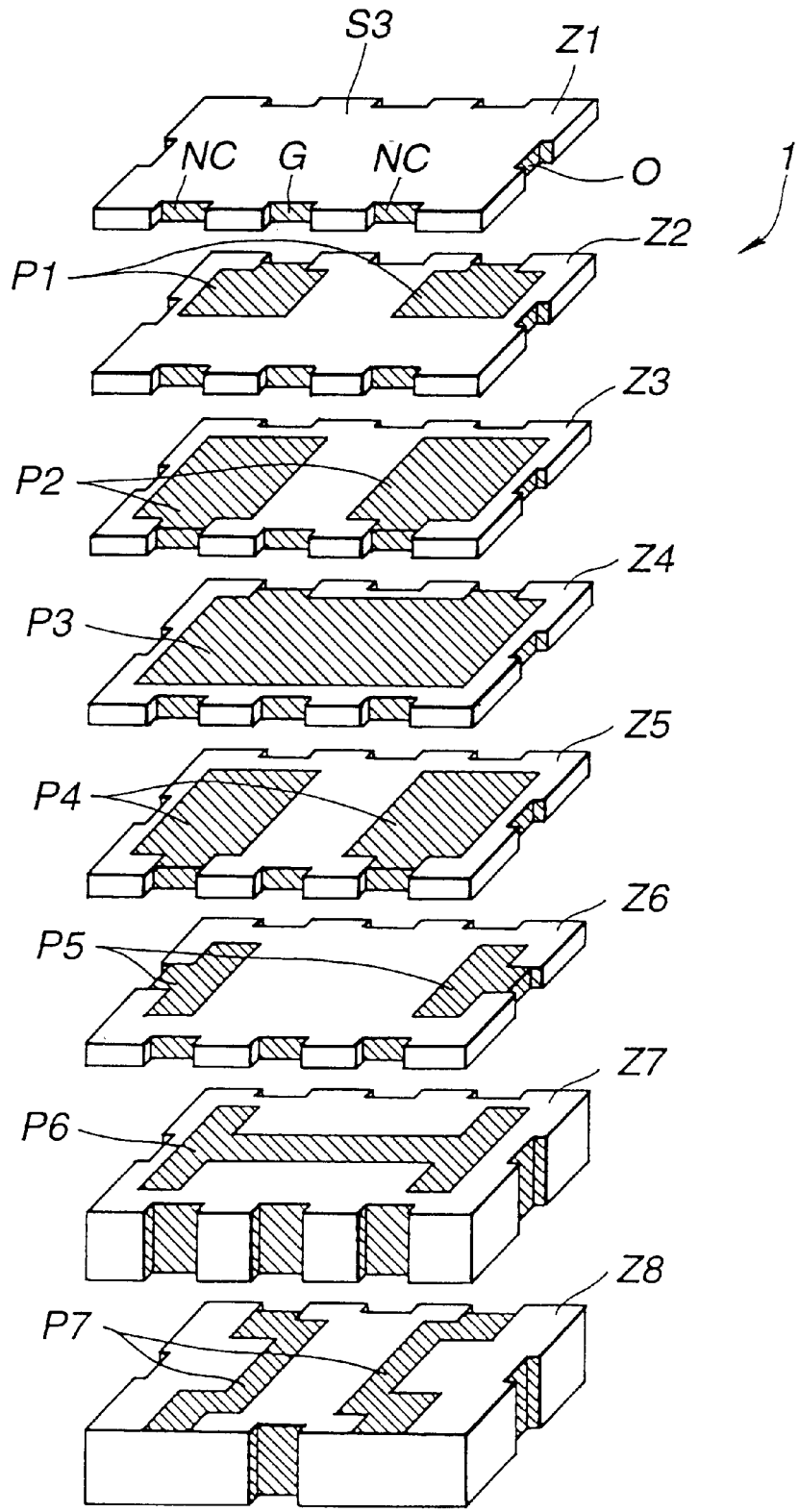
FIG. 5 is an exploded perspective view of the multilayer microelectronic circuit of FIG. 1.

Referring now to FIGS. 1 to 6, an embodiment of a multilayer microelectronic circuit according to the present invention is illustrated by the reference numeral 1. The multilayer microelectronic circuit of this embodiment is constructed as a resonator. The resonator 1 comprises eight dielectric (insulating) layers Z1 to Z8 each of which is formed from a green sheet of a dielectric ceramic material as shown in FIG. 5. First to seventh patterned electrodes P1 to P7 are respectively formed on the upper surfaces of the second to eighth dielectric layers Z2 to Z8 other than that of the upper-most or first dielectric layer Z1, by screen-printing an electrically conductive paste. In production, the dielectric layers Z1 to Z8 in the state of the green sheet are placed one upon another so that each of the patterned electrodes P1 to P7 is held between adjacent two of the dielectric layers Z1 to Z8, thus forming a green or laminated structure of the resonator 1. Then, the green structure of the resonator 1 is baked or sintered thereby forming the resonator 1 as shown in FIGS. 1 to 4.

Each of the dielectric layers Z1 to Z8 is formed at its peripheral surface with grooves (no numerals) which extend in the direction of thickness thereof, in the state of the green sheet. The grooves of the respective dielectric layers are connected with each other to form a channel 2 which is formed at the side surfaces S1 of the resonator 1 and extend in the direction of thickness of the resonator 1, in the state of the green structure of the resonator 1 in which the respective dielectric layers Z1 to Z8 are laminated The surface of each channel 2 is metallized to form grounding lines G, an input line I, an output line O, signal lines NC, as shown in FIGS. 1 to 4. The lines G, I, O, NC may be formed by applying the electrically conductive paste at the surfaces of the channels of the green structure and then by baking the electrically conductive paste.

Figure 6:
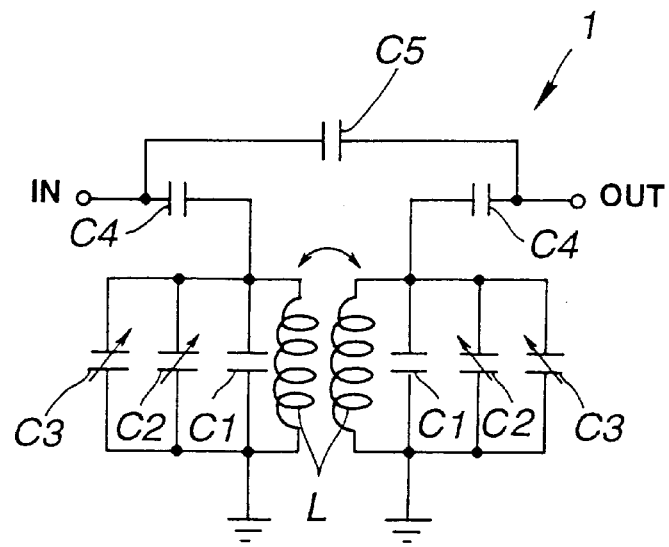
FIG. 6 is a circuit diagram of an equivalent electric circuit for the multilayer microelectronic circuit of FIG. 1.
Figure 7:
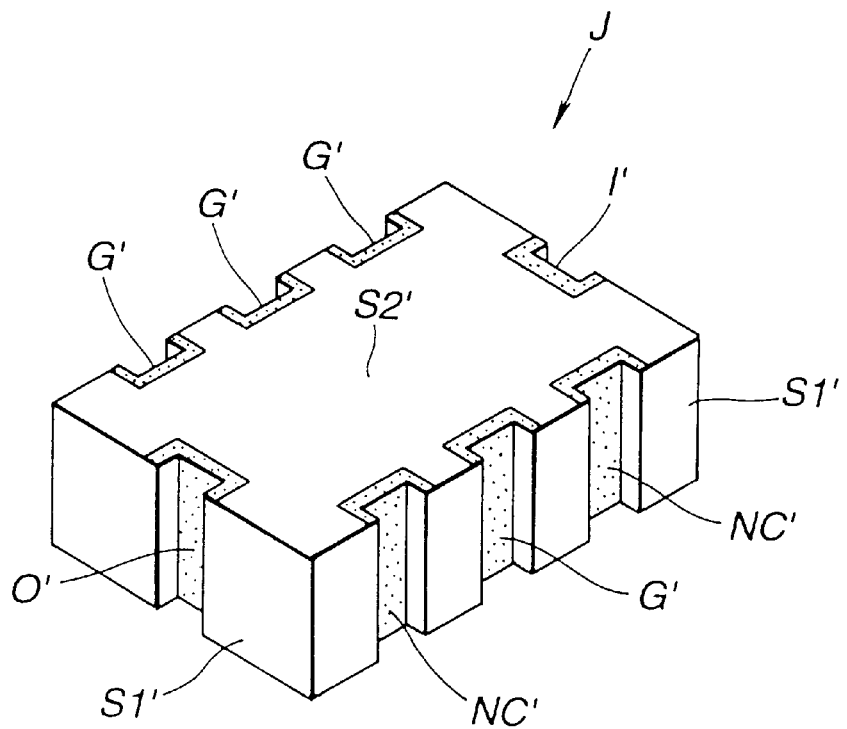
FIG. 7 is a perspective view of a conventional multilayer microelectronic circuit, as viewed from a direction in which the lower surface is observed.
Figure 8:
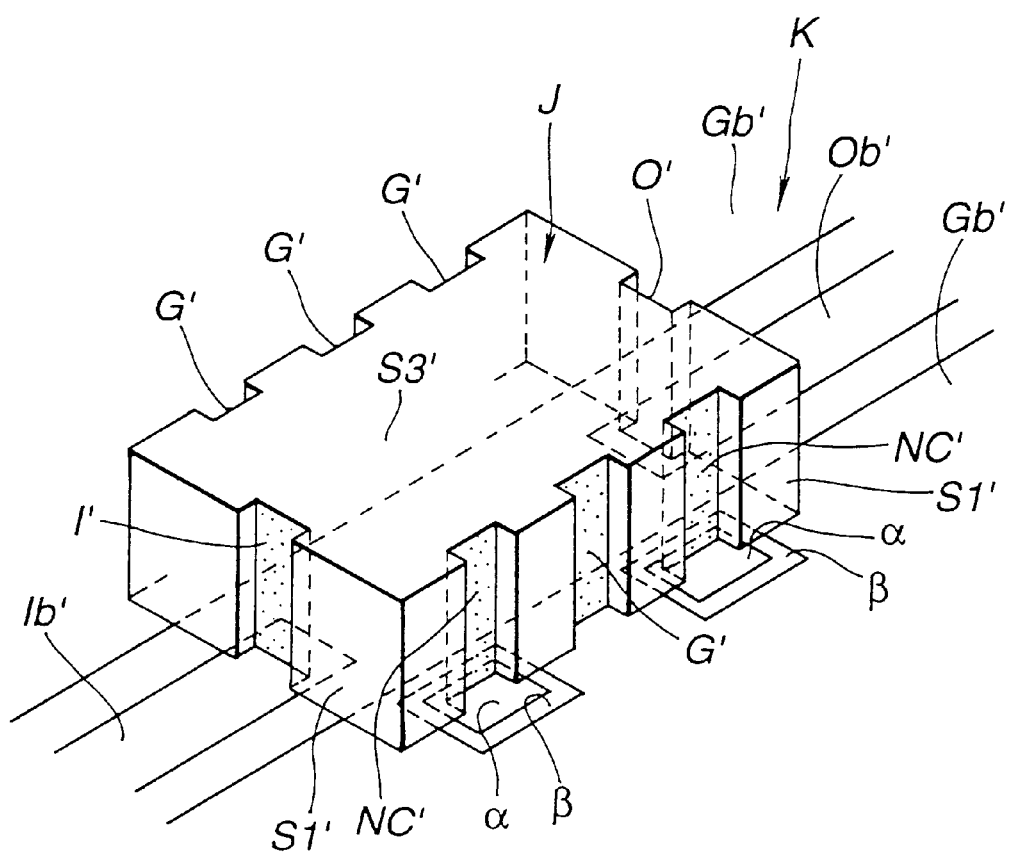
FIG. 8 is a perspective view of the conventional multilayer microelectronic circuit of FIG. 7 in a state to be directly mounted at its lower surface on a substrate, as viewed from a direction in which the upper surface of the circuit is observed.

The resonator 1 has an equivalent circuit shown in FIG. 6. The equivalent circuit includes two resonant inductors L, two resonant capacitors C1, two rough adjustment capacitors C2, two fine adjustment capacitors C3, two input/output capacitors C4, and a polarizing capacitor C5 through which input and output terminals are connected. Each of the inductors and each of the capacitors are constituted of some of the first to seventh patterned electrodes P1 to P7. More specifically, each resonant capacitor C1 is constituted of the fourth dielectric layer Z4 and the third and fourth patterned electrodes P3, P4 which are located on the upper- and lower surfaces of the fourth dielectric layer Z4. Each rough adjustment capacitor C2 is constituted of the third dielectric layer Z3 and the second and third patterned electrodes P2, P3 which are located at the upper and lower surfaces of the third dielectric layer Z3. Each fine adjustment capacitor C3 is constituted of the second dielectric layer Z2 and the first and second patterned electrodes P1, P2 located respectively at the upper- and lower surfaces of the second dielectric layer Z2. Each input/output capacitor C4 is constituted of the fifth dielectric layer Z5 and the fourth and fifth patterned electrodes P4, P5 located respectively at the upper and lower surfaces of the fifth dielectric layer Z5. Additionally, each resonant inductor L is constituted of the seventh patterned electrode P7 located at the upper surface of the eighth dielectric layer Z8.

The resonator 1 of this embodiment is adjusted in its resonant frequency by the following technique: The second patterned electrode P2 having a large area is subjected to trimming by using a laser cutting device (not shown) so as to roughly adjust the capacitance (for setting the resonant frequency) of the resonator 1. Additionally, the first patterned electrode P1 having a small area is subjected to trimming by using the laser cutting device so as to finely adjust the capacitance of the resonator.

Figure 1:
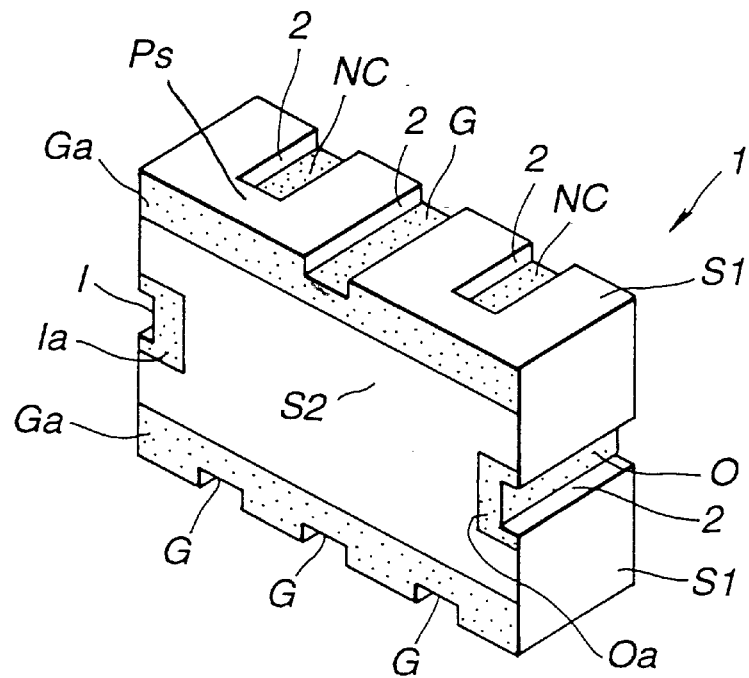
FIG. 1 is a perspective view of an embodiment of a multilayer microelectronic circuit according to the present invention, as viewed from a direction in which a lower side of the circuit is observed.
Figure 2:
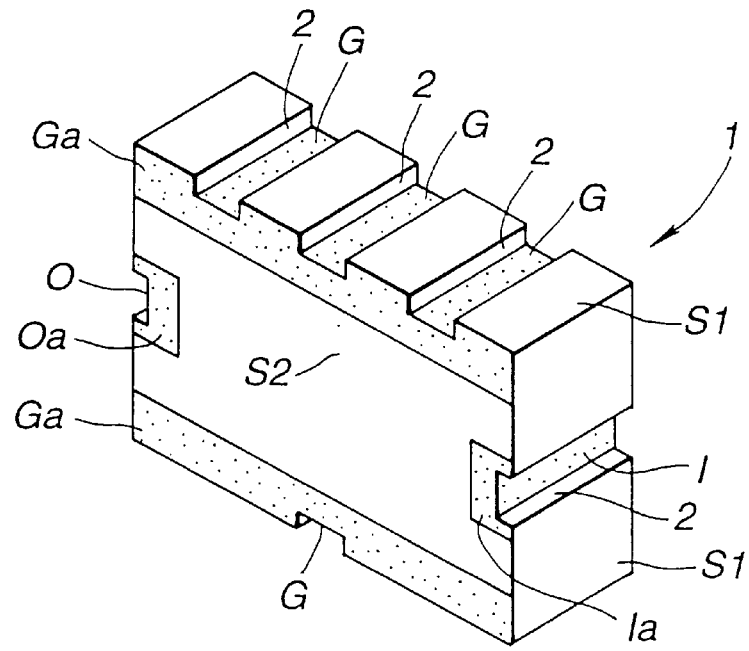
FIG. 2 is a perspective view similar to FIG. 1 but showing the multilayer microelectronic circuit of FIG. 1 in a state to be located upside down relative to the state of FIG. 1.
Figure 3:
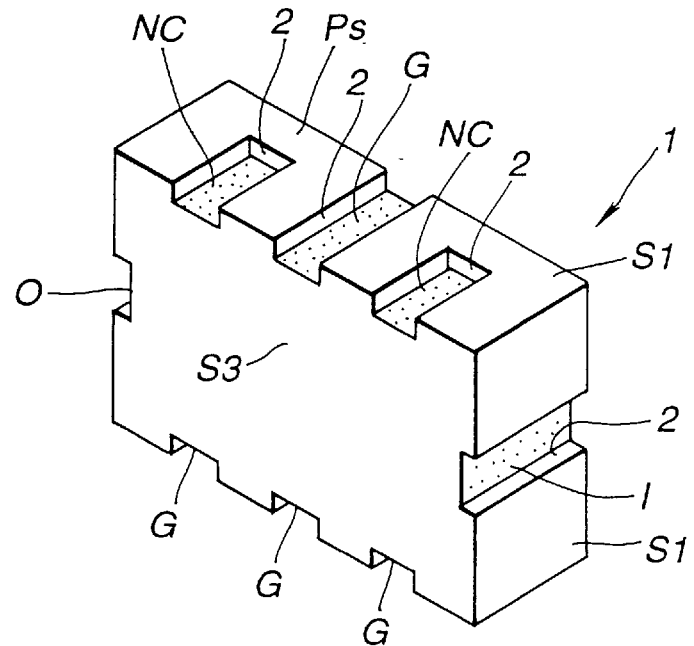
FIG. 3 is a perspective view of the multilayer microelectronic circuit of FIG. 1 as viewed from a direction in which a upper side of the circuit is observed.

The resonator 1 of this embodiment is used upon being directly put or mounted on a substrate 3 as shown in FIG. 4. The resonator 1 is provided at its lower (back-side) surface or mounting surface S2 (at which the resonator 1 is directly mounted on the substrate 3) with a patterned grounding contact Ga, a patterned input contact Ia, and a patterned output contact Oa as shown in FIGS. 1 and 2. The patterned grounding contact Ga is connected with the patterned grounding lines G, so that the patterned grounding line G is brought into connection with a patterned grounding contact Gb formed at the surface of the substrate 3, in a state where the resonator 1 is directly mounted on the substrate 3. The input line I is adapted to connect one of two sections of the fifth patterned electrode P5 with the patterned input contact Ia, so that the input line I is brought into connection with the patterned input contact Ib of the substrate 3 in the state where the resonator 1 is directly mounted on the substrate as shown in FIG. 4. Similarly, The output line O is adapted to connect the other of the two sections of the fifth patterned electrode P5 with the patterned output contact Oa, so that the output line O is brought into connection with the patterned output contact Ob of the substrate 3 in the state where the resonator 1 is directly mounted on the substrate as shown in FIG. 4. It will be understood that the patterned input and output contacts Ib, Ob are formed at the surface of the substrate 3.

The signal lines NC are adapted to connect the second, fourth, and seventh patterned electrodes P2, P4, P7 with each other, so that the signal lines are separate and insulated from electrical contact with the substrate 3 in a state where the resonator 1 is directly mounted on the substrate 3 as shown in FIG. 4. Thus, each of the signal lines NC has a lower end separate from the lower surface or mounting surface S2 (at which the resonator 1 is directly mounted on the substrate 3) of the resonator 1. In other words, each signal line NC is kept in a disconnected state at its lower end. This state of each signal line NC is accomplished by avoiding formation of the groove at the peripheral surface of the eighth or lower-most dielectric layer Z8, the groove forming part of each channel 2 serving as the signal line NC. Accordingly, the surface of a portion Ps located between the lower end of the signal line NC and the lower surface S2 is formed flush with the side surface S1. The surface of the portion Ps is not metallized, and therefore each signal line NC is insulated from electrical contact with the patterned grounding contact Gb of the substrate 3. It will be understood that the above-mentioned lower surface S2 of the resonator 1 is parallel with the upper surface S3 and generally perpendicular to the side surfaces S1.

As appreciated from the above, according to this embodiment, the signal lines NC of the resonator 1 are formed in the disconnected state at their lower end formed at the side surface of the resonator 1, thereby overcoming the problem of the signal lines NC being brought into connection with the patterned grounding contacts Gb even though the resonator 1 is directly mounted on the substrate 3 as shown in FIG. 4. Thus, it is unnecessary to process the resonator 1 in such a manner to disconnect the signal lines NC, and therefore the resonator 1 is largely improved in its serviceableness as compared with conventional similar resonators. Additionally, the disconnected state of the signal lines NC is accomplished by forming no channel (2) at the portion Ps of the eighth dielectric layer Z8 contiguous with each signal line NC. Accordingly, obtaining the disconnected state of the signal lines NC can be largely facilitated thereby lowering the production cost of the resonator 1.

While the disconnected state of the signal lines NC has been shown and described as being accomplished by forming no channel at the portion (of the dielectric layer) contiguous with each signal line in the above embodiment, it will be understood that the disconnected state may be formed by other means, for example, first by forming each signal line NC to extend to the lower surface of the resonator (like in the conventional resonator) and then by trimming or cutting an end section of the thus formed signal line NC which end section reaches the lower surface.

Although only the resonator has been shown and described as an example of the multilayer microelectronic circuit in the above embodiment, it will be appreciated that the principle of the present invention may be applied to other multilayer microelectronic circuits having other functions, and to a hybrid integrated circuit provided at its surface with electric devices.

What is claimed is:

1. A microelectronic circuit to be directly mounted on a substrate, comprising:
    a structure including an electrical circuit and having side surfaces;
    an input line formed at one of said side surfaces and connected with an input section of said electrical circuit;
    an output line formed at one of said side surfaces and connected with an output section of said electrical circuit;
    a grounding line formed at one of said side surfaces and connected with a grounding section of said electrical circuit; and
    a signal line formed at one of said side surfaces, for connecting sections of said electrical circuit, said signal line having an end positioned adjacent a mounting surface at which said microelectronic circuit is directly mounted on the substrate, the end of said signal line being separate from said mounting surface so as to be insulated from electrical contact with the substrate.

2. A microelectronic circuit as claimed in claim 1, wherein each of said input line, said output line, said grounding line, and said signal line is a metallized surface of a channel formed at one of said side surfaces, wherein said channel corresponding to said signal line is formed to be prevented from extending to a portion of said structure between the end of said signal line and the mounting surface, said portion having a surface which is flush with the side surface of said structure.

3. A multilayer microelectronic circuit to be directly mounted on a substrate, comprising:
    a plurality of dielectric layers and patterned electrodes which are laminated one upon another to form a laminated structure, said dielectric layers and said patterned electrodes forming an electrical circuit, said laminated structure having side surfaces extending along a direction in which said dielectric layers and said patterned electrodes are laminated;
    an input line formed at one of said side surfaces and connected with an input section of said electrical circuit;
    an output line formed at one of said side surfaces and connected with an output section of said electrical circuit;
    a grounding line formed at one of said side surfaces and connected with a grounding section of said electrical circuit; and
    a signal line formed at one of said side surfaces, for connecting sections of said electrical circuit, said signal line having an end positioned adjacent a mounting surface at which said multilayer microelectronic circuit is directly mounted on the substrate, the end of said signal line being separate from said mounting surface so as to be insulated from electrical contact with the substrate.

4. A multilayer microelectronic circuit as claimed in claim 3, wherein each of said input line, said output line, said grounding line, and said signal line is a metallized surface of a channel formed at one of said side surfaces, wherein said channel corresponding to said signal line is formed to be prevented from extending to a portion of said laminated structure between the end of said signal line and the mounting surface, said portion having a surface which is flush with the side surface of said laminated structure.

5. A multilayer microelectronic circuit as claimed in claim 4, wherein said channel corresponding to said signal line is formed to be prevented from extending to a peripheral portion of said dielectric layer whose lower surface serves as the mounting surface.

6. A multilayer microelectronic circuit as claimed in claim 3, wherein each dielectric layer is formed of a dielectric ceramic material, and each patterned electrode is formed of a baked electrically conductive paste and formed on each dielectric layer.

7. A multilayer microelectronic circuit as claimed in claim 3, wherein a state in which the end of said signal line is separate from said mounting surface is established by trimming an end section of a linear arrangement which includes said signal line and extends throughout the side surface to reach said mounting surface, said end section being formed contiguous with the end and located between the end of said signal line and said mounting surface.

8. A multilayer microelectronic circuit to be directly mounted on a substrate, comprising:

a plurality of dielectric layers and patterned electrodes which are laminated one upon another to form a laminated structure, said dielectric layers and said patterned electrodes forming an electrical circuit, said laminated structure having side surfaces extending along a direction in which said dielectric layers and said patterned electrodes are laminated, said dielectric layers including a lower-most dielectric layer which has a mounting surface at which said multilayer microelectronic circuit is directly mounted on the substrate, said dielectric layers other than said lower-most dielectric layer being formed respectively with grooves which form a channel at one of the side surfaces, said lower-most dielectric layer being free of said groove;

an input line formed at one of said side surfaces and connected with an input section of said electrical circuit;

an output line formed at one of said side surfaces and connected with an output section of said electrical circuit;

a grounding line formed at one of said side surfaces and connected with a grounding section of said electrical circuit; and a signal line formed at the surface of said channel, for connecting sections of said electrical circuit, said signal line having an end positioned adjacent said mounting surface, the end of said signal line being separate from said mounting surface so as to be insulated from electrical contact with the substrate.

* * * * *